United States Patent
Kuroda

(12) 
(10) Patent No.: US 6,501,208 B1
(45) Date of Patent: Dec. 31, 2002

(54) COMPENSATED SURFACE ACOUSTIC WAVE FILTER HAVING A LONGITUDINAL MODE RESONATOR CONNECTED WITH A SECOND RESONATOR

(75) Inventor: Yasushi Kuroda, Asahikawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/462,483

(22) PCT Filed: Jul. 21, 1998

(86) PCT No.: PCT/JP98/03247

§ 371 (c)(1),
(2), (4) Date: Feb. 22, 2000

(87) PCT Pub. No.: WO99/04489

PCT Pub. Date: Jan. 28, 1999

(30) Foreign Application Priority Data

Jul. 18, 1997 (JP) ............................................... 9-194374

(51) Int. Cl.[7] .......................... H01L 41/04; H01L 41/08; H01L 41/18; H02N 2/00; H03H 9/00
(52) U.S. Cl. ............................... 310/313 R; 310/313 A; 310/313 B; 310/313 D; 333/193; 333/195
(58) Field of Search ...................... 310/313 R, 313 A, 310/313 B, 313 C; 333/193, 194, 195, 196

(56) References Cited

U.S. PATENT DOCUMENTS

| | | | | |
|---|---|---|---|---|
| 3,839,687 A | * | 10/1974 | Subramanian | 333/72 |
| 3,882,433 A | * | 5/1975 | Subramanian | 333/72 |
| 4,384,264 A | * | 5/1983 | Kadota | 333/193 |
| 5,446,330 A | * | 8/1995 | Eda et al. | 310/313 R |
| 5,559,483 A | * | 8/1996 | Kajihara et al. | 333/195 |
| 5,592,040 A | * | 1/1997 | Yamamoto | 310/313 D |
| 5,592,135 A | * | 1/1997 | Taguchi et al. | 333/193 |
| 5,604,393 A | * | 2/1997 | Suzuki et al. | 310/313 D |
| 5,729,186 A | * | 3/1998 | Seki et al. | 333/194 |
| 5,874,868 A | * | 2/1999 | Shimoe | 310/313 B |
| 5,895,996 A | * | 4/1999 | Takagi et al. | 310/313 R |
| 5,912,602 A | * | 6/1999 | Takagi et al. | 333/193 |
| 6,037,700 A | * | 3/2000 | Tanaka et al. | 310/313 D |
| 6,127,769 A | * | 10/2000 | Kadota et al. | 310/313 B |
| 6,160,339 A | * | 12/2000 | Takagi et al. | 310/313 D |
| RE37,102 E | * | 3/2001 | Tada | 333/193 |

FOREIGN PATENT DOCUMENTS

JP          410276062 A    *   10/1998

* cited by examiner

*Primary Examiner*—Thomas M. Dougherty
*Assistant Examiner*—Julio Gonzalez
(74) *Attorney, Agent, or Firm*—Oblon, Spivak, McClelland, Maier & Neustadt, P.C.

(57) ABSTRACT

A surface acoustic wave filter having a first surface acoustic wave resonator 10 which is a two-port resonator utilizing longitudinal mode coupling and a second surface acoustic wave resonator 20 connected to a series arm of the first surface acoustic wave resonator 10 on a piezoelectric substrate. The duty of the second surface acoustic wave resonator 20 is set to be smaller than the duty of the first surface acoustic wave resonator 10. Consequently the reflectance per electrode finger of the second surface acoustic wave resonator 20 can be smaller than that of the first surface acoustic wave resonator 10. Therefore, even when the effect of the inductance component is added to the characteristics of the second surface acoustic wave resonator 20, the increase of the difference between the resonance frequency $f_r$ and the anti-resonance frequency $f_{ar}$ can be suppressed. Therefore, the filter loss is low at the high frequency side of the pass band of the surface acoustic wave filter, and an excellent attenuation characteristics are obtained in a vicinity of the high frequency side of the pass band.

17 Claims, 6 Drawing Sheets

W : ELECTRODE FINGER WIDTH

P : ELECTRODE FINGER PITCH $\dfrac{W}{P}$ : DUTY

COMPENSATED SURFACE ACOUSTIC WAVE FILTER HAVING A LONGITUDINAL MODE RESONATOR CONNECTED WITH A SECOND RESONATOR

TECHNICAL FIELD

The present invention relates to a surface acoustic wave filter utilizing surface acoustic waves, in particular to a surface acoustic wave filter that has a two-port acoustic wave resonator utilizing longitudinal mode coupling and a surface acoustic wave resonator connected thereto and formed on the same piezoelectric substrate therewith.

BACKGROUND ART

RF SAW (Surface acoustic wave) filters employed in vehicle telephones and portable telephones have pass bands mainly in the frequency range of from several hundred MHz to several GHz. The frequency and the necessary frequency bandwidth depend on the mobile telephone system being employed. In general, the bandwidth is required to be several percent in terms of specific bandwidth.

In addition, a low insertion loss is required for the SAW filters employed in these mobile telephones or the like. Therefore, the following SAW filters have been dominantly used for these applications. These are ladder type filters in which SAW resonators are connected in ladder as disclosed in Japanese Patent Laid-open Application No. HEI 5-183380, longitudinal mode coupled resonant SAW filters in which a plurality of inter digital transducers (IDTs) having comb-shaped electrodes are put between reflectors as disclosed in Japanese Laid-open Application No. HEI 4-207615, and a combination of these two type filters.

Any one of the SAW filters mentioned above can realize filters of relatively small insertion loss. When these SAW filters are employed in RF filters of portable telephones, piezoelectric substrates possessing relatively large electromechanical coupling factor $k^2$ such as 36° Y-X $LiTaO_3$, 64° Y-X $LiTaO_3$, 41° Y-X $LiTaO_3$, or like, have been widely used. The reason is that the possible pass bandwidth of these SAW filters largely depends on the electromechanical coupling factor $k^2$ of piezoelectric substrates formed thereon.

These piezoelectric substrates, however, have the following disadvantages. The conversion loss from a surface acoustic wave to a bulk wave on a substrate of these piezoelectric substrates increases as the thickness of the conductive films forming IDTs or reflectors increases. For this reason, the SAW filters show a large insertion loss when the filters are formed with an increased film thickness. On the other hand, when the film thickness decreases, the electrical resistance of the electrodes forming IDTs on the piezoelectric substrate increases. Therefore, the filters show a large insertion loss also when the filters are formed with a decreased film thickness. Thus there is a range of its optimum values for the conductive film thickness h formed on one of these piezoelectric substrates. The range of the optimum values in terms of normalized film thickness (h/λ) normalized by the wavelength λ of the SAW that propagates on the piezoelectric substrate is approximately several percent (approximately 3 to 8 percent).

Normally, a SAW filter in which a two-port SAW resonator utilizing longitudinal mode coupling and another SAW resonator are connected, is formed by patterning a conductive thin film for instance Al thin film or slightly Si and Cu containing Al film or like on a piezoelectric substrate. Then the two SAW resonators are formed with the same film thickness.

The bandwidth of the frequency pass-band required for the mobile communication system is broad such that the width is approximately several percent in terms of specific bandwidth. Therefore, the two-port SAW resonator utilizing longitudinal mode coupling is formed on a piezoelectric substrate possessing high electromechanical coupling factor $k^2$ chosen from the substrates described above with a normalized conductive film thickness in the prescribed range. In addition, the electrode finger width W divided by the disposed electrode finger pitch P (W/P, abbreviating as a duty hereinafter) is set at approximately 50 to 65 percent for the purpose of reducing insertion loss in many cases.

The SAW resonator connected to the two-port acoustic wave resonator has an effect of attenuating signals in the vicinity of the two-port SAW resonator pass band. Since the transmission band and the reception band are located in a very close vicinity in mobile communication systems, the SAW resonator connected to the two-port SAW resonator is largely used in order to have the filter characteristics of attenuating either one of the transmission band or the reception band.

The SAW resonator connected to the two-port SAW resonator utilizing longitudinal mode coupling, however, is formed with the same film thickness as that of the two-port SAW resonator in which broad bandwidth is required. Accordingly, the SAW resonator connected to the two-port SAW resonator is apt to have a relatively large frequency difference between the resonance frequency and the anti-resonance frequency thereof.

In addition, since the wiring of the two-port SAW resonator utilizing longitudinal mode coupling is relatively complicated in its structure, the wiring carries a certain amount of inductance component. Other inductance components are added by the package, the bonding wire and so on.

As these inductance components are loaded to the SAW resonator connected to the two-port SAW resonator, the substantial frequency difference between the resonance frequency and the anti-resonance frequency of the resonator further increases.

The SAW resonator connected to a series arm of the two-port SAW resonator can obtain steep attenuation characteristics at the anti-resonance frequency and pass characteristics at the neighborhood of the resonance frequency of the connected oscillator. When the SAW filter is required to have an attenuation band at a frequency range in the vicinity of the high frequency side of the pass band, the anti-resonance frequency of the series arm SAW resonator is needed to locate in a vicinity of a low frequency edge of the attenuation band.

In this case, there is no problem when the resonance frequency of the SAW resonator connected to a series arm of the two-port resonator is located approximately at the center of the pass band of the two-port SAW resonator utilizing longitudinal mode coupling. However, when the resonance frequency of the SAW resonator connected to the two-port SAW resonator shifts towards the lower frequency side of the pass band, the filter loss at the high frequency side of the pass band increases. As the result, the pass band characteristics of the SAW filter as a whole have pass band characteristics having unfavorably dull shoulder. That is to say, the SAW filter loss at the high frequency side of the pass band becomes large in the case when the filter is required to have an attenuation band at a frequency range in the vicinity of the high frequency side of the pass band.

The present invention is carried out to solve these problems.

The object of the present invention is to provide a SAW filter having low loss and excellent cut-off characteristics, in particular to provide a SAW filter for mobile communication applications excellent in attenuation characteristics in the vicinity of high frequency side of a pass band.

DISCLOSURE OF INVENTION

A SAW filter of the present invention comprises a SAW filter, comprising a piezoelectric substrate, a first SAW resonator disposed on the piezoelectric substrate so as to have a first duty, the first SAW resonator being a two-port SAW resonator utilizing longitudinal mode coupling and having IDTs each comprising a pair of comb-shaped electrodes, and a second SAW resonator on the piezoelectric substrate so as to have a second duty smaller than the first duty, the second SAW resonator being connected to a series arm of the first SAW resonator on the piezoelectric substrate and having an IDT comprising a pair of comb-shaped electrodes.

The first duty and the second duty can be adjusted so that reflectance per electrode finger constituting the IDT of the second SAW resonator becomes smaller than that of the first SAW resonator.

In addition, the first duty and the second duty can be adjusted so that the electromechanical coupling factor of the IDT of the second SAW resonator coupled with the piezoelectric substrate becomes smaller than that of the IDT of the first SAW resonator coupled with the piezoelectric substrate.

Further, the wiring connecting the first SAW resonator having three or more of IDTs and the second SAW resonator can be disposed so as to go around a pad which is connected to a ground side electrode of at least one IDT electrode pair of the first surface acoustic wave resonator. Then, an increase of the frequency difference between the resonance frequency and the anti-resonance frequency of the second SAW resonator can be avoided.

For the piezoelectric substrate, a 36° Y-cut X-propagation LiTaO$_3$ substrate can be used. Other piezoelectric substrates, for instance, such as 64° Y-cut X-propagation LiTaO$_3$, 41° Y-cut X-propagation LiNbO$_3$, 45° X-cut Z-propagation Li$_2$B$_4$O$_7$ or the like can be used.

In addition, when a 36° Y-cut X-propagation LiTaO$_3$ substrate or a piezoelectric substrate equivalent with this is used, the film thickness of electrodes constituting the first and second SAW resonators is preferable to be in the range of from approximately 6 percent to approximately 8 percent in terms of normalized film thickness (h/λ), and the first duty is preferable to be in the range of from approximately 45 percent to approximately 60 percent and the second duty is in the range of approximately 45 percent or less. Thus, a SAW filter having excellent frequency characteristics can be obtained.

Namely, the SAW filter of the present invention comprises a two-port first SAW resonator utilizing longitudinal mode coupling disposed on a piezoelectric substrate and a second SAW resonator connected to a series arm of the first SAW resonator. Here, the duty (electrode finger width/electrode finger pitch) of the second SAW resonator is made smaller than the duty of the first SAW resonator.

By adopting this SAW filter constitution of the present invention, the reflectance per electrode finger of the second SAW resonator can be set smaller than that of the two-port first SAW resonator utilizing longitudinal mode coupling to which the first SAW resonator is connected. Accordingly, the frequency difference between the resonance frequency f$_r$ and the anti-resonance frequency f$_{ar}$ can be made small even when effects of inductance components are added to the characteristics of the second SAW resonator. As a result, the loss increase at the high frequency side of the SAW filter pass band can be reduced and an excellent attenuation characteristics in the vicinity of high frequency side of the pass band can be obtained. In addition, a high productivity of the SAW filters can be obtained since there is no need for changing the film thickness between the first SAW resonator and the second SAW resonator.

The present invention avoids an unfavorable effect due to inductance components added to the second SAW resonator by making the values of the electromechanical coupling factor k$^2$ and the reflectance small. Practically, the duty of the second SAW resonator is made smaller than that of the first SAW resonator so as to make the reflectance per electrode finger of the second SAW resonator be smaller than that of the first SAW resonator. Moreover, a similar effect can be obtained, for instance, by making thinner the film thickness of the electrode constituting the second SAW resonator. In this case, each film thickness of the resonators is required to adjust individually for a plurality of SAW resonators disposed on the same piezoelectric substrate. Accordingly, fabrication process of SAW filters becomes sophisticated sacrificing their productivity. The SAW filter of the present invention having the same film thickness h for the first SAW resonator and second SAW resonator can be produced with a high productivity.

BEST MODE FOR CARRYING OUT THE INVENTION

In the following, SAW filters of the present invention will be explained in more detail.

(Embodiment 1)

Figure 1:
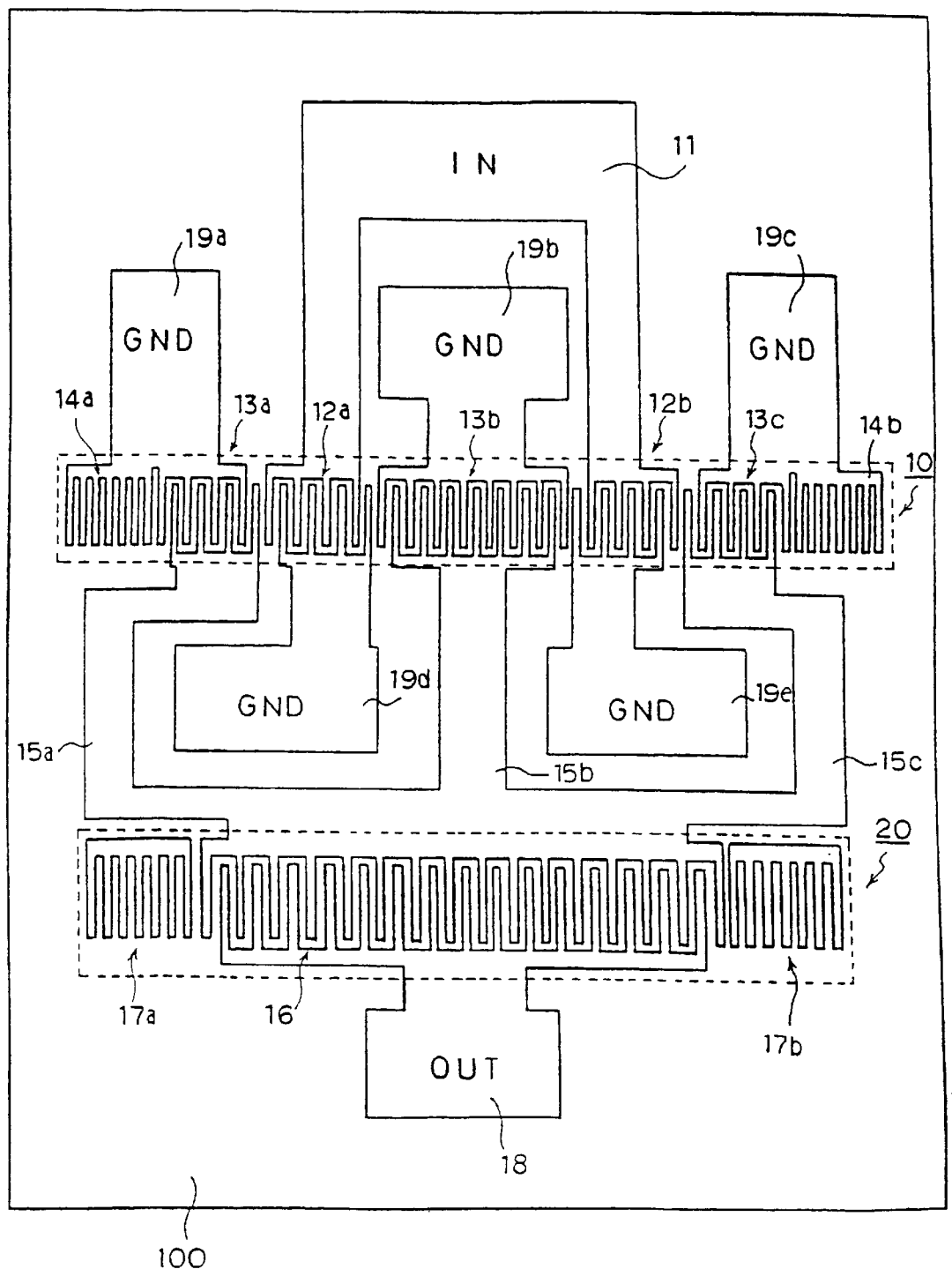
FIG. 1 is a diagram showing schematically a SAW filter constitution of the present invention.

FIG. 1 is a diagram showing schematically a constitution of a SAW filter of the present invention.

In this SAW filter, a first SAW resonator 10 formed on a piezoelectric substrate 100 and a second SAW resonator 20 connected to a series arm of the first SAW resonator 10 are interposed between input and output terminals. The first SAW resonator 10 is a two-port SAW resonator utilizing longitudinal mode coupling. The second SAW resonator 20 is a one-port SAW resonator.

Both the first SAW resonator 10 and the second SAW resonator 20 comprise IDTs having interleaved comb-shaped electrode pair arrangements and reflectors formed in grating structure.

The first SAW resonator 10 is connected to an input pad 11. The first SAW resonator 10 comprises the IDTs 12a and 12b converting electrical signals supplied to the input pad 11 to SAWs, the three IDTs 13a, 13b and 13c receiving the SAWs excited by the IDTs 12a and 12b to convert to electrical signals, and reflectors 14a and 14b positioned so as to put these IDTs between the reflectors.

The second SAW resonator 20 comprises receiving IDTs 13a, 13b and 13c, an IDT 16 connected through wiring 15a, 15b and 15c and reflectors 17a and 17b positioned so as to put the IDT 16 between the two reflectors. One IDT of the IDT 16 is connected electrically to an output bonding pad 18.

The input pad 11, an output pad 18, and ground pads 19a, 19b, 19c, 19d and 19e, are connected to an external circuit of an envelope or others by bonding wires via conductive bumps that are not shown in the figure.

Inductance components due to a bonding wire connected to the output bonding pad 18 and due to wiring from the two-port first SAW resonator utilizing longitudinal mode coupling 10 via 15a, 15b and 15c are added to the second SAW resonator 20.

Figure 2A:
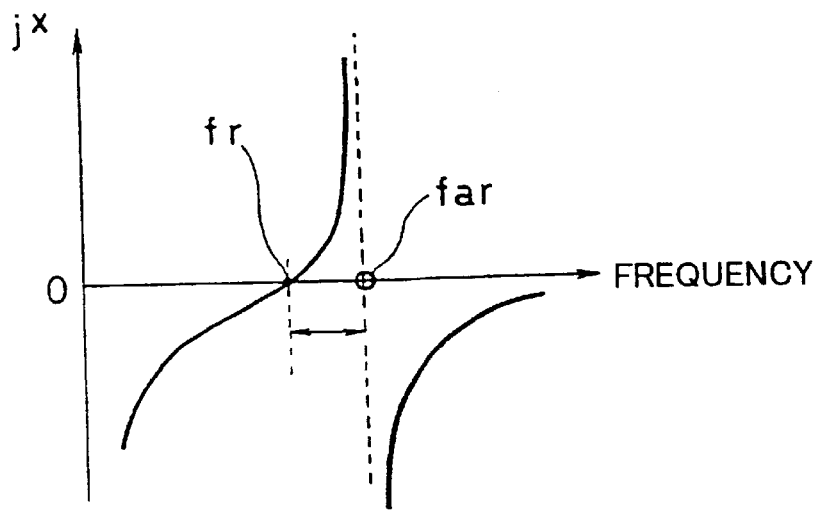
FIGS. 2A, 2B and 2C are diagrams showing schematically relationships between the frequency and the reactance jX of the second SAW resonator.
Figure 2B:
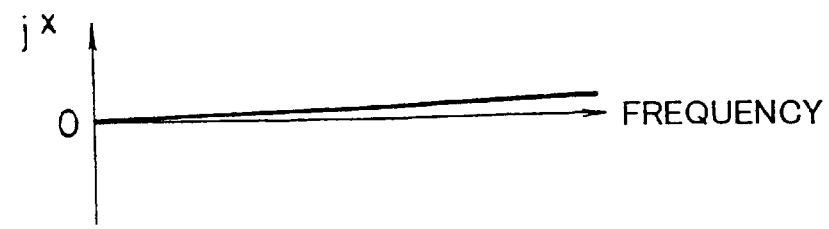
Figure 2C:
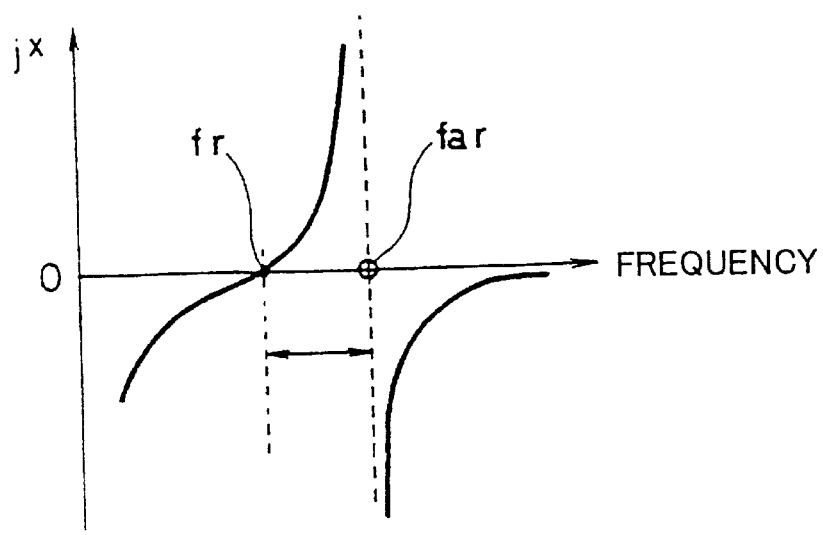

FIGS. 2A, 2B and 2C are diagrams showing relationship between the frequency and the reactance components jX of the second SAW resonator 20 qualitatively. FIG. 2A shows the reactance component of the second SAW resonator 20 itself. FIG. 2B shows the net reactance component corresponding to the added inductance components. FIG. 2C shows the reactance component corresponding to the net inductance components of the second SAW resonator itself and added inductance components. In these figures, the ordinate scales are not the same.

From FIGS. 2A, FIG. 2B and FIG. 2C, it is shown that the frequency difference between the resonance frequency fr and the anti-resonance frequency far of the second SAW resonator 20 becomes larger by adding the inductance components.

Here, the location of the anti-resonance frequency $f_{ar}$ is determined by the frequency region where signal attenuation is required in the vicinity of the high frequency side of the pass band. Accordingly, if the resonance frequency $f_r$ shifts excessively towards lower frequency side, the reactance component increases at the high frequency side of the pass band due to the inductance of second SAW resonator itself and the added inductance, and therefore the filter loss increases there.

In order to reduce such loss increase, the first SAW resonator 10 and the second SAW resonator 20 are formed on a piezoelectric substrate so that the duty of the second SAW resonator 20 becomes smaller than that of the two-port first SAW resonator utilizing longitudinal mode coupling 10 in the SAW filter of the present invention.

Figure 3:
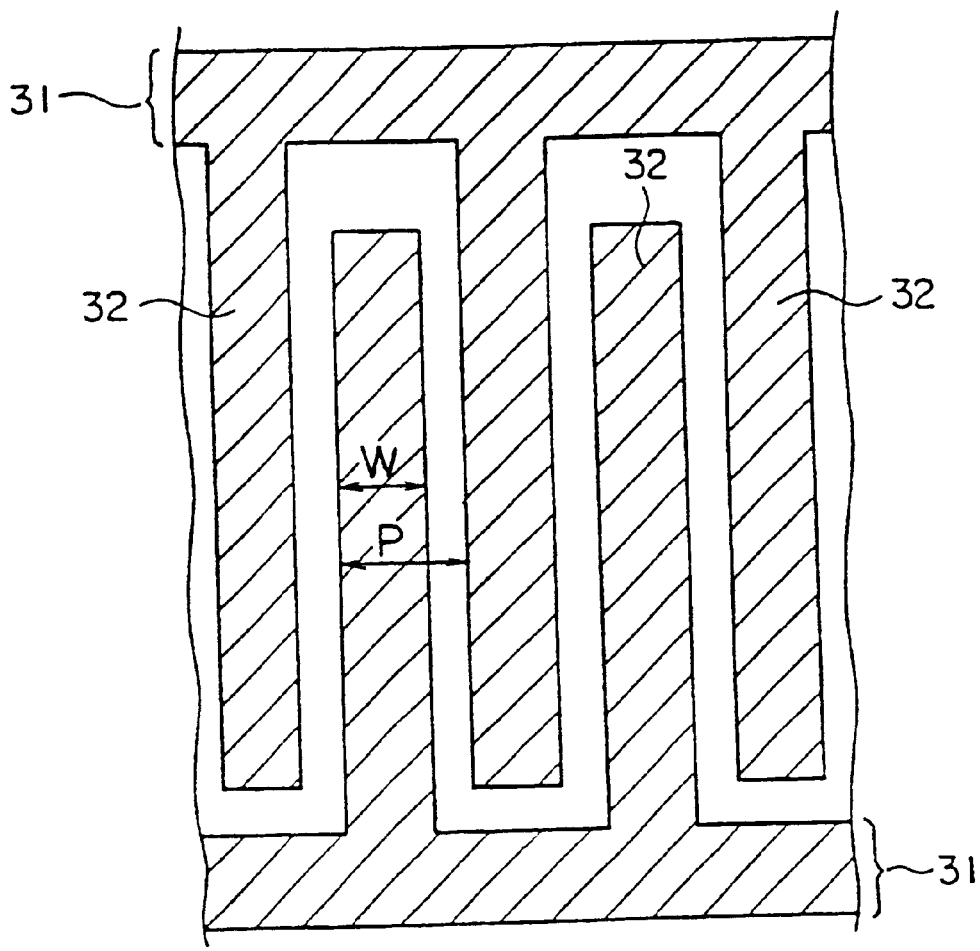
FIG. 3 is a diagram for explaining a duty of an IDT.

FIG. 3 is a diagram for explaining the duty. An IDT 30 is constituted of electrode fingers 32 connected to bus bars 31. Here, the ratio of an electrode finger width W and electrode finger pitch P, W/P, is designated as a duty. The SAW filter of the present invention is constructed such that the ratio (electrode finger width W)/(electrode finger pitch P) of the second SAW resonator 20 becomes smaller than that of the first SAW resonator 10.

In the SAW filter illustrated in FIG. 1 as an embodiment of the present invention, the the two-port first SAW resonator utilizing longitudinal mode coupling 10 is formed to have a duty of approximately 50 percent. On the other hand, the second SAW resonator 20 is formed to have a duty of approximately 40 percent.

By adopting such constitution, the reflectance of SAW (including leaky SAW, SSBW or the like) per electrode finger can be reduced and then the frequency difference between the resonance frequency $f_r$ and the anti-resonance frequency $f_{ar}$ of the SAW resonator 20 connected in series decreases.

Figure 4:
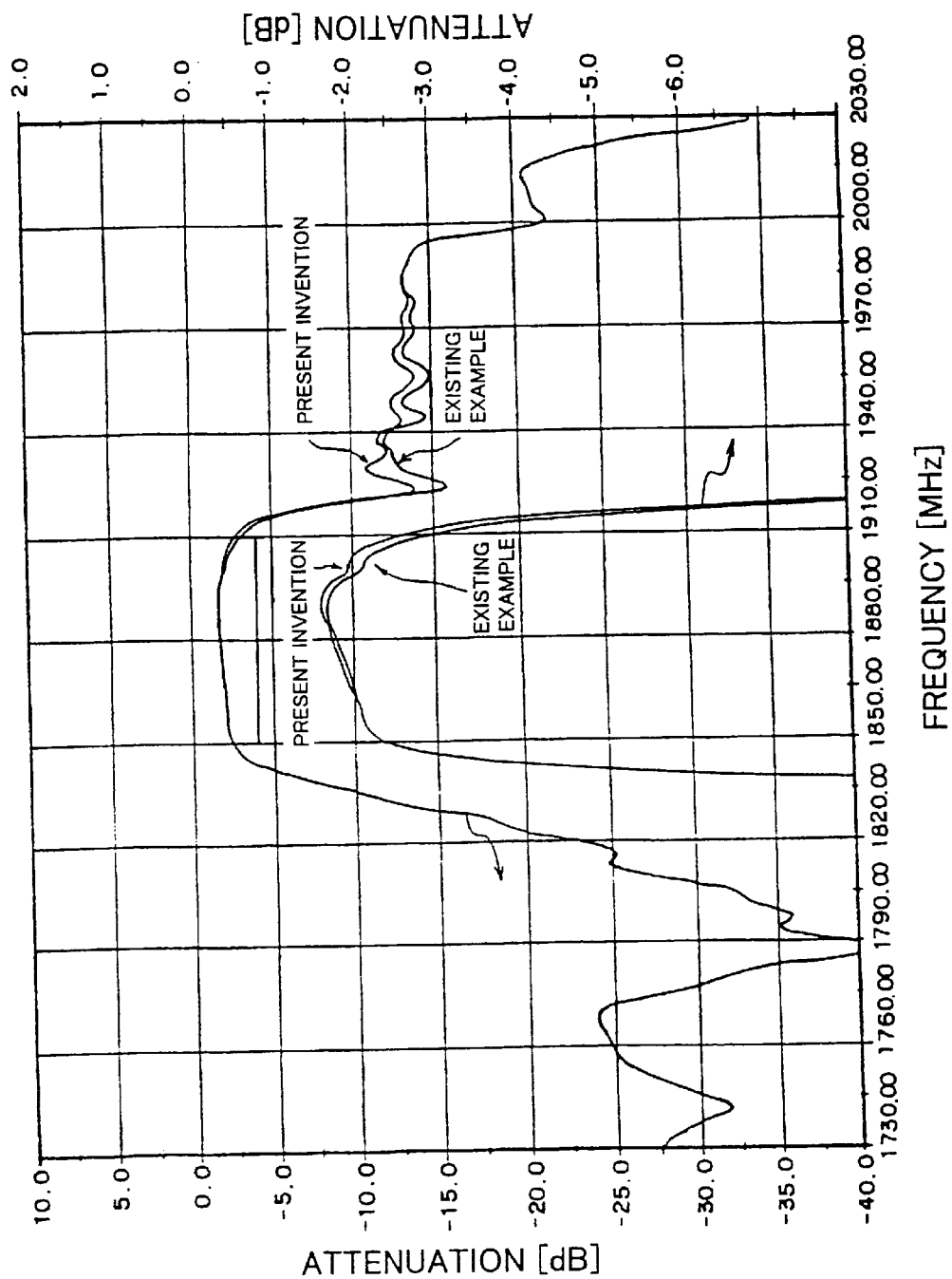
FIG. 4 is a diagram showing one example of the frequency characteristics of a SAW filter of the present invention.

FIG. 4 is a diagram showing an example of frequency characteristics of a SAW filter of the present invention. Here, performances of a SAW filter that is used as a Tx (for transmission use) filter of a PCS (Personal Communication System) illustrated in FIG. 1 is taken as an example for explanation. The ordinate scale given at the left side is applied for the entire profile and that given at the right side is applied for the enlarged profile of the pass band in FIG. 4.

The center frequency of this SAW filter is 1880 MHz, and the bandwidth required for this system is 60 MHz. The receiving bandwidth of this system is 60 MHz having the center frequency at 1960 MHz. For the Tx filter, it is required to attenuate signals of this band in the vicinity of high frequency side of the pass band. In this case, the frequency interval between adjacent bands of the system is approximately 20 MHz. Accordingly, a very steep shoulder shape (attenuation characteristics) is required for the SAW filter in order to have a sufficient allowance for frequency fluctuation due to temperature variation of the piezoelectric substrate constituting the SAW filter or variable factors such as thickness fluctuation of Al film during formation of the SAW filter or the like.

FIG. 4 obviously shows that the SAW filter of the present invention have steep attenuation characteristics at the high frequency side of the pass band compared with an existing filter. As seen from this example, we find that the SAW filter of the present invention can have a steep shoulder performance at the high frequency side of the pass band.

Figure 5:
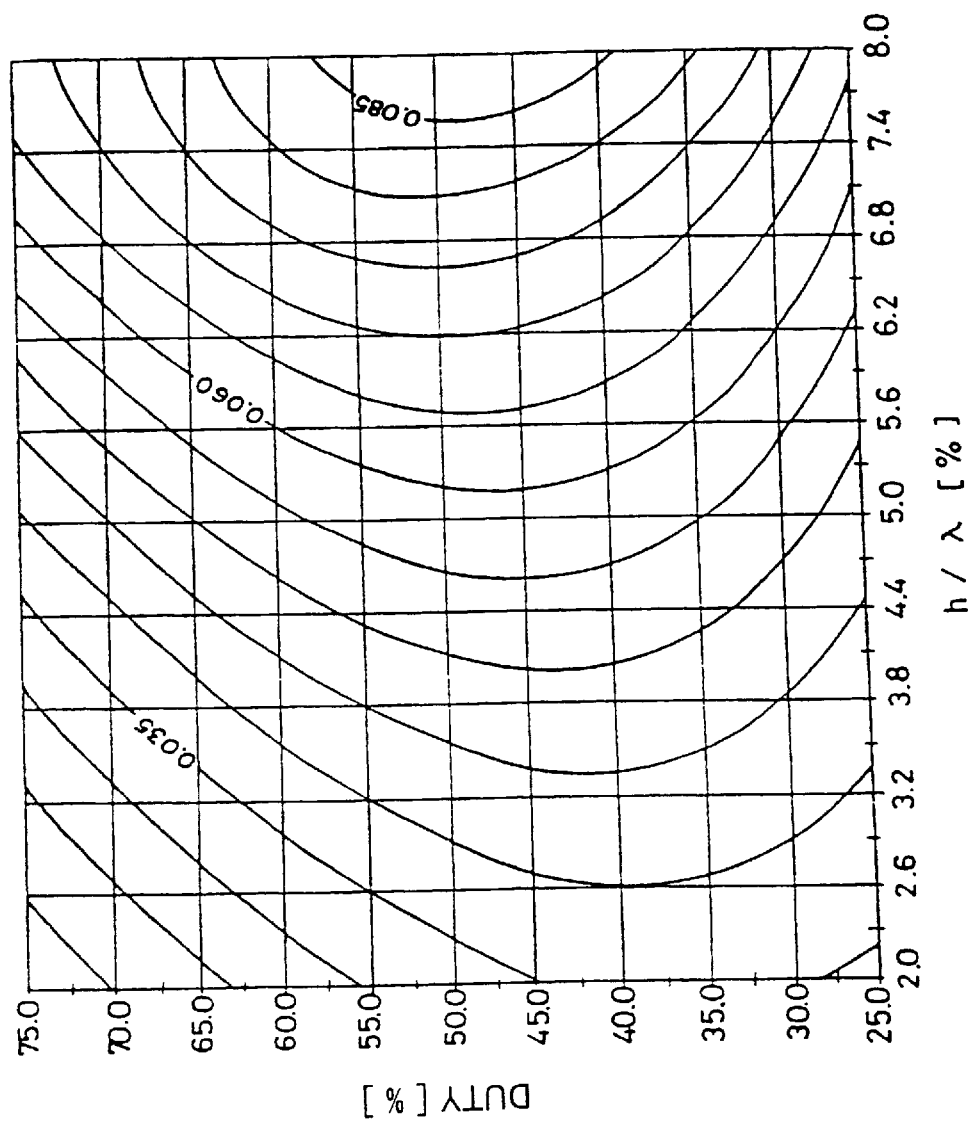
FIG. 5 is a diagram showing simulated results showing the duty and the normalized film thickness on 36° Y-cut X-propagation LiTaO$_3$ substrate vursus the reflectance by using a finite element method.

FIG. 5 is a diagram showing a simulation result about the reflectance as a function of the normalized film thickness (h/λ) and the duty for 36° Y-cut X-propagation $LiTaO_3$ substrate by a finite element method. In the figure, the reflectance is shown for one electrode finger as the contour.

In this piezoelectric substrate, the reflectance has its peak around the duty of approximately 50 percent for the normalized film thickness in the range of from approximately 6 percent to approximately 8 percent. Accordingly, the favorable characteristics can be obtained by setting the duty of the two-port first SAW resonator utilizing longitudinal mode coupling to the range of from approximately 45 percent to approximately 60 percent and the duty of the second SAW resonator to the range of approximately 45 percent or less.

In the SAW filter of the present invention, the duty of the second SAW resonator is not set on the side where the reflectance is made small by increasing the duty with respect to the duty where the maximum reflectance is obtained at the same film thickness. The reason is that the second SAW resonator with a large duty (broad) is difficult to form since the second SAW resonator is set at the higher frequency side compared with the two-port first SAW resonator utilizing longitudinal mode coupling.

Thus, in the SAW filter of the present invention, the first and second SAW resonators are formed by adjusting the respective duties thereof so that the reflectance per electrode finger constituting the IDT of the second SAW resonator becomes smaller than that of the first SAW resonator. In this way, the resonance frequency $f_r$ of the second SAW resonator is prevented from shifting towards the lower frequency side, even when the first SAW resonator and second SAW resonator are disposed on the same piezoelectric substrate with the same film thickness.

As a result of the invention mentioned above, SAW filters having an excellent pass band characteristics by the SAW filter in which these SAW resonators are combined. In particular, the steep shoulder shape can be obtained even when inductance components are added to the second SAW resonator due to bonding wire or wiring. Accordingly, the SAW filter can have a sufficient allowance for variable factors such as the frequency characteristics changes due to a temperature variation of the piezoelectric substrate being used for the SAW filter or the fluctuation of the film thickness h of the conductive thin film during formation. In addition, an excellent performance, reliability and productivity of the SAW filters can be obtained.

(Embodiment 2)

Figure 6:
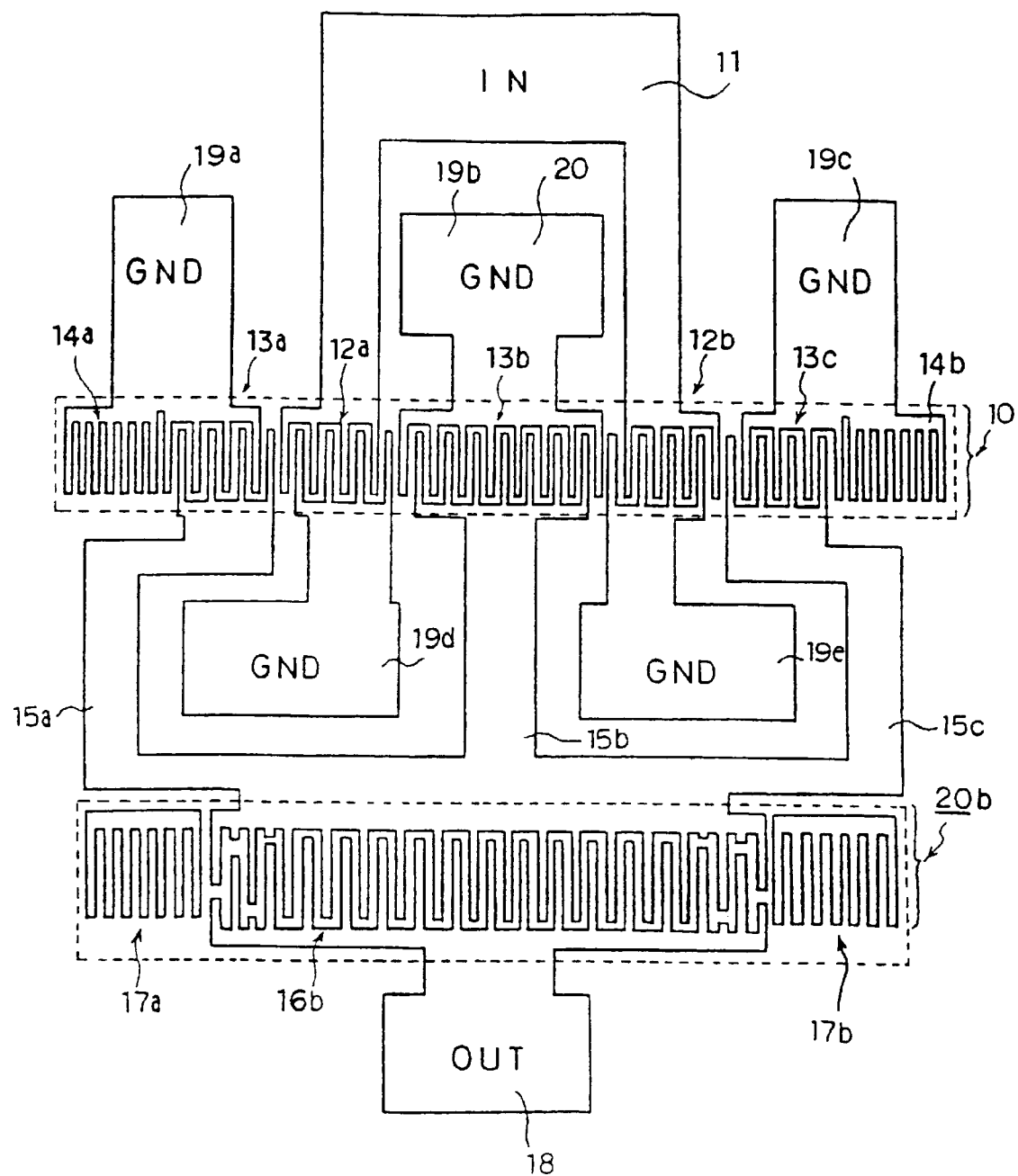
FIG. 6 is a diagram schematically showing another SAW filter example of the present invention.

FIG. 6 is a diagram schematically showing another SAW filter construction example of the present invention. This SAW filter is provided with an IDT 16b comprising comb-shaped electrodes having apodization structure as a second SAW resonator 20b.

Here, in particular, we can prevent the filter characteristics deterioration at the high frequency side of the pass band due to lateral mode spurious occurring when the aperture length of the second SAW resonator is large by adopting this structure.

(Embodiment 3)

A SAW filter having a constitution illustrated in FIG. 1 was actually fabricated.

As a piezoelectric substrate 100, a 36° Y-cut X-propagation LiTaO$_3$ wafer was employed.

On the wafer consisting of 36° Y-cut X-propagation LiTaO$_3$, a conductive thin film of Al added with Si, Cu and the like was formed by using a sputtering method. The film thickness h of the conductive film was set at 0.16 μm. The film thickness h corresponds to approximately 7.4 percent in terms of converted film thickness (h/λ) normalized by the wavelength λ at the operating frequency.

Then, the conductive film was patterned by using photo-etching method to form a first SAW resonator 10 and a second SAW resonator 20 illustrated in FIG. 1. The two-port first SAW resonator utilizing longitudinal mode coupling 10 was patterned to have a duty of approximately 50 percent. On the other hand, the second SAW resonator 20 was patterned to have a duty of approximately 40 percent. SAW filters having the same structure were formed in a large number on the wafer at once and were separated one by one using a dicing method.

In an existing SAW filter, film thickness h for the first SAW filter 10 and for the second SAW filter 20 is required to be varied. Accordingly, the area where a SAW resonator is formed is additionally etched to make the film thinner, while covering with a resist the area where the other SAW resonator is formed. Alternatively, the area where a SAW resonator is formed is additionally sputtered to make the film thick, while covering the area with a resist where the other SAW resonator is formed. For this reason, the fabricating process of the SAW filters is complicated and is in low productivity. For instance, as the number of repetition for etching process increases and control of the etching states become difficult because the film thickness of the conductive films is required to be varied.

In the SAW filter of the present invention, both of the first SAW resonator 10 and the second SAW resonator 20 can be constituted in the same film thickness h. Accordingly, the length of the conductive film formation process and the patterning the formed conductive film process decreases, and which results in a remarkable advance in the SAW filter productivity.

Industrial Applicability

As explained in the above, the filter loss at the high frequency side of the pass band can be reduced and excellent attenuation characteristics in the vicinity of the high frequency area of the pass band can be obtained by the SAW filters of the present invention in which the first SAW resonator and the second SAW resonator are disposed by adjusting the respective duties thereof so that the reflectance per electrode finger constituting a IDT of the second SAW resonator is smaller than that of the first SAW resonator.

In particular, a steep shoulder characteristics can be obtained even when inductance components due to bonding wires or wiring are added to the second SAW resonator. Accordingly, the SAW filter can have a sufficient allowance for variable factors such as frequency fluctuation due to temperature variation of the piezoelectric substrate being used in the SAW filter or thickness fluctuation of the conductive film during formation of the SAW filter. In addition, characteristics, excellent saw filter reliability and productivity can be obtained.

What is claimed is:

1. A surface acoustic wave filter, comprising:
   a piezoelectric substrate;
   a first surface acoustic wave resonator disposed on the piezoelectric substrate so as to have a first duty, the first surface acoustic wave resonator being a two-port surface acoustic wave resonator utilizing longitudinal mode coupling and having IDTs each comprising a pair of comb-shaped electrodes, and
   a second surface acoustic wave resonator on the piezoelectric substrate so as to have a second duty smaller than the first duty, the second surface acoustic wave resonator being connected to a series arm of the first surface acoustic wave resonator on the piezoelectric substrate and having an IDT comprising a pair of comb-shaped electrodes.

2. The surface acoustic wave filter as set forth in claim 1:
   wherein the IDTs of the first surface wave resonator and the IDT of the second surface acoustic wave resonator differ in their thickness.

3. The surface acoustic wave filter as set forth in claim 1:
   wherein the first surface acoustic wave resonator comprises three or more of IDTs, and a wiring connecting the first surface acoustic wave resonator and the second surface acoustic wave resonator is disposed so as to go around a pad which is connected to a ground side electrode of at least one IDT electrode pair of the first surface acoustic wave resonator.

4. The surface acoustic wave filter as set forth in claim 1:
   wherein the piezoelectric substrate comprises a 36° Y-cut X-propagation LiTaO$_3$.

5. The surface acoustic wave filter as set forth in claim 1:
   wherein each film thickness of the electrodes constituting the first surface acoustic wave resonator and the second surface acoustic wave resonator is in the range of from approximately 6 percent to approximately 8 percent in terms of normalized film thickness, and the first duty is in the range of from approximately 45 percent to approximately 60 percent and the second duty is in the range of approximately 45 percent or less.

6. A surface acoustic wave filter, comprising:
   a piezoelectric substrate;
   a first surface acoustic wave resonator disposed on the piezoelectric substrate so as to have a first reflectance per an electrode finger, first surface acoustic wave resonator being a two-port surface acoustic wave resonator utilizing longitudinal mode coupling and having IDTs each comprising a pair of comb-shaped electrodes; and a second surface acoustic wave resonator on the piezoelectric substrate so as to have a second reflectance per an electrode finger smaller than the first reflectance per an electrode finger, the second surface acoustic wave resonator being connected to a series arm of the first surface acoustic wave resonator on the piezoelectric substrate and having an IDT comprising a pair of comb-shaped electrodes.

7. The surface acoustic wave filter as set forth in claim 6:

wherein the IDTs of the first surface wave resonator are disposed to have a first duty and the IDT of the second surface acoustic wave resonator is disposed to have a second duty smaller than the first duty.

8. The surface acoustic wave filter as set forth in claim 6:

wherein the IDTs of the first surface wave resonator and the IDT of the second surface acoustic wave resonator differ in their thickness.

9. The surface acoustic wave filter as set forth in claim 6:

wherein the first surface acoustic wave resonator comprises three pairs or more of IDTs, and a wiring connecting the first surface acoustic wave resonator and the second surface acoustic wave resonator is disposed so as to go around a pad which is connected to a ground side electrode of at least one IDT electrode pair of the first surface acoustic wave resonator.

10. The surface acoustic wave filter as set forth in claim 6:

wherein the piezoelectric substrate comprises a 36° Y-cut X-propagation $LiTaO_3$.

11. The surface acoustic wave filter as set forth in claim 7:

wherein the normalized film thickness of the electrodes constituting the first surface acoustic wave resonator and the second surface acoustic wave resonator is in the range of from approximately 6 percent to approximately 8 percent, and the first duty is in the range of from approximately 45 to approximately 60 percent and the second duty is in the range of approximately 45 percent or less.

12. A surface acoustic wave filter, comprising:

a piezoelectric substrate;

a first surface acoustic wave resonator disposed on the piezoelectric substrate so as to have a coupling with the piezoelectric substrate by a first electromechanical coupling factor, the first surface acoustic wave resonator being a two-port surface acoustic wave resonator utilizing longitudinal mode coupling and having IDTs each comprising a pair of comb-shaped electrodes; and a second surface acoustic wave resonator on the piezoelectric substrate so as to have a coupling with the piezoelectric substrate by a second electromechanical coupling factor smaller than the first electromechanical coupling factor, the second surface acoustic wave resonator being connected to a series arm of the first surface acoustic wave resonator on the piezoelectric substrate and having an IDT comprising a pair of comb-shaped electrodes.

13. The surface acoustic wave filter as set forth in claim 12:

wherein the first IDT is disposed to have a first duty and the second IDT is disposed to have a second duty smaller than the first duty.

14. The surface acoustic wave filter as set forth in claim 12:

wherein the IDTs of the first surface wave resonator and the IDT of the second surface acoustic wave resonator differ in their thickness.

15. The surface acoustic wave filter as set forth in claim 12:

wherein the first surface acoustic wave resonator comprises three or more of IDTs, and a wiring connecting the first surface acoustic wave resonator and the second surface acoustic wave resonator is disposed so as to go around a pad which is connected to a ground side electrode of at least one IDT electrode pair of the first surface acoustic wave resonator.

16. The surface acoustic wave filter as set forth in claim 12:

wherein the piezoelectric substrate comprises a 36° Y-cut X-propagation $LiTaO_3$.

17. The surface acoustic wave filter as set forth in claim 13:

wherein the normalized film thickness of electrodes constituting the first surface acoustic wave resonator and the second surface acoustic wave resonator is in the range of from approximately 6 percent to approximately 8 percent, and the first duty is in the range of from approximately 45 to approximately 60 percent and the second duty is approximately 45 percent or less.

\* \* \* \* \*